(12) United States Patent
Takai et al.

(10) Patent No.: US 11,098,397 B2
(45) Date of Patent: Aug. 24, 2021

(54) YTTRIUM FLUORIDE SPRAY MATERIAL, YTTRIUM OXYFLUORIDE-DEPOSITED ARTICLE, AND MAKING METHODS

(71) Applicant: Shin-Etsu Chemical Co., Ltd., Tokyo (JP)

(72) Inventors: Yasushi Takai, Echizen (JP); Noriaki Hamaya, Echizen (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 295 days.

(21) Appl. No.: 16/407,206

(22) Filed: May 9, 2019

(65) Prior Publication Data

US 2019/0264315 A1 Aug. 29, 2019

Related U.S. Application Data

(62) Division of application No. 15/331,324, filed on Oct. 21, 2016, now Pat. No. 10,538,836.

(30) Foreign Application Priority Data

Oct. 23, 2015 (JP) ................................ 2015-208616

(51) Int. Cl.
| | |
|---|---|
| C23C 4/11 | (2016.01) |
| C09D 7/40 | (2018.01) |
| C23C 4/134 | (2016.01) |
| C09D 1/00 | (2006.01) |
| H01J 37/32 | (2006.01) |
| H01L 21/67 | (2006.01) |
| C08K 3/16 | (2006.01) |

(52) U.S. Cl.
CPC .................. *C23C 4/11* (2016.01); *C09D 1/00* (2013.01); *C09D 7/69* (2018.01); *C23C 4/134* (2016.01); *H01J 37/32495* (2013.01); *H01L 21/67069* (2013.01); *C08K 3/16* (2013.01)

(58) Field of Classification Search
None
See application file for complete search history.

(56) References Cited

U.S. PATENT DOCUMENTS

| | | | |
|---|---|---|---|
| 6,576,354 B2 | 6/2003 | Tsukatani et al. | |
| 6,685,991 B2 | 2/2004 | Wataya et al. | |
| 7,462,407 B2 | 12/2008 | Maeda et al. | |
| 7,655,328 B2 | 2/2010 | Maeda et al. | |
| 2002/0160189 A1 | 10/2002 | Wataya et al. | |
| 2010/0129670 A1 | 5/2010 | Sun et al. | |
| 2013/0122283 A1 | 5/2013 | Hamaya et al. | |
| 2014/0057078 A1 | 2/2014 | Hamaya et al. | |
| 2015/0096462 A1 | 4/2015 | Fukagawa et al. | |
| 2015/0111037 A1 | 4/2015 | Fukagawa et al. | |
| 2016/0326623 A1 | 11/2016 | Nagayama et al. | |
| 2017/0088930 A1 | 3/2017 | Ibe et al. | |

FOREIGN PATENT DOCUMENTS

| | | |
|---|---|---|
| CN | 102245540 A | 11/2011 |
| JP | 3523222 B2 | 4/2004 |
| JP | 3672833 B2 | 7/2005 |
| JP | 3894313 B2 | 3/2007 |
| JP | 4905697 B2 | 3/2012 |
| JP | 2013-122086 A | 6/2013 |
| JP | 5396672 B2 | 1/2014 |
| JP | 2014-40634 A | 3/2014 |
| JP | 2014-109066 A | 6/2014 |
| JP | 2014-136835 A | 7/2014 |
| JP | 2016-211070 A | 12/2016 |

OTHER PUBLICATIONS

Office Action dated Jul. 29, 2020, issued in counterpart CN Application No. 201610918492.1, with English translation (17 pages).
Office Action dated Dec. 26, 2017, issued in counterpart Japanese Application No. 2016-203613, with English machine translation. (4 pages).
Catalog of "Apparatus for measurement of particle distribution, Microtrac Series", MicrotracBEL Corp., Mar. 2017; cited in Japanese Submission of Publication dated Mar. 27, 2018. (12 pages).
Sakashita, S. "Basic Technology of Powder for Color Material Engineers, Chapter 1, Physical Properties of Powder", J. Jpn. Soc. Colour Mater., 2005, 78(4), pp. 168-184; cited in Japanese Submission of Publication dated Mar. 27, 2018.
Yamamoto, K. et al, "Methods and Actual Cases of High Accuracy Particle Size Measurement", Report of Miyazaki Prefectural Industrial Technology Center & Miyazaki Prefectural Food R&D Center, 2006, No. 51, pp. 13-17; cited in Japanese Submission of Publication dated Mar. 27, 2018.
Submission of Publication dated Mar. 27, 2018, issued in Japanese Application No. 2016-203613. (7 pages).
Notification of Submission of Publication dated Apr. 3, 2018. (1 page).

*Primary Examiner* — Colin W. Slifka
(74) *Attorney, Agent, or Firm* — Westerman, Hattori, Daniels & Adrian, LLP

(57) ABSTRACT

An yttrium fluoride spray material contains $Y_5O_4F_7$ and $YF_3$, and has an average particle size of 10-60 μm and a bulk density of 1.2-2.5 g/cm³. The $Y_5O_4F_7$ and $YF_3$ in the yttrium fluoride spray material consist of 30 to 90% by weight of $Y_5O_4F_7$ and the balance of $YF_3$. A sprayed coating of yttrium oxyfluoride is obtained by atmospheric plasma spraying of the spray material.

6 Claims, No Drawings

YTTRIUM FLUORIDE SPRAY MATERIAL, YTTRIUM OXYFLUORIDE-DEPOSITED ARTICLE, AND MAKING METHODS

CROSS-REFERENCE TO RELATED APPLICATION

This application is a divisional of U.S. application Ser. No. 15/331,324 filed on Oct. 21, 2016, now U.S. Pat. No. 10,538,836, and is based upon and claims the benefits of priority from Japanese Patent Application No. 2015-208616 filed on Oct. 23, 2015, the entire contents of which are incorporated herein by reference.

TECHNICAL FIELD

This invention relates to an yttrium oxyfluoride-deposited article for use in the plasma etching step of the semiconductor device fabrication process, an yttrium fluoride spray material for use in making the article, and making methods thereof.

BACKGROUND ART

In the etching step of the semiconductor device fabrication process, treatment is carried out in a corrosive halogen-base gas plasma atmosphere. While the etching system includes parts which are exposed to the halogen-base gas plasma, parts having coatings formed by spraying yttrium oxide or yttrium fluoride to the surface of metallic aluminum or aluminum oxide ceramic substrates are known to be fully corrosion resistant and used in practice. See Patent Documents 1 to 4. Typical corrosive halogen-base gases used in the process for manufacturing semiconductor devices are fluorine-base gases such as $SF_6$, $CF_4$, $CHF_3$, $ClF_3$ and HF and chlorine-base gases such as $Cl_2$, $BCl_3$ and HCl.

Yttrium oxide-deposited parts obtained by atmospheric plasma spraying of yttrium oxide suffer from few technical problems and have long been utilized as semiconductor-related spray members. On the other hand, yttrium fluoride-sprayed coatings suffer from technical problems despite excellent corrosion resistance. For example, during atmospheric plasma spraying of yttrium fluoride, the yttrium fluoride is passed through a flame of 3,000° C. or higher and melted therein, whereby the fluoride can be decomposed. Then the coating partially contains a mixture of fluoride and oxide. For this reason, the practical utilization of yttrium fluoride-deposited parts is delayed as compared with the oxide-deposited parts.

When yttrium oxide-deposited parts are used in the etching process with fluorine gas, there arises the problem that the etching process becomes unstable because outermost yttrium oxide reacts with a fluorine-base gas at the initial of the process, and so the fluorine-base gas concentration within the equipment varies. This problem is known as "process shift." The replacement by yttrium fluoride-deposited parts is under consideration. However, yttrium fluoride tends to have slightly low corrosion resistance in a halogen-base gas plasma atmosphere, as compared with yttrium oxide. In addition, yttrium fluoride sprayed coatings have many crevices on their surface and release many particles, as compared with yttrium oxide sprayed coatings.

It is thus believed that yttrium oxyfluoride having characteristics of both yttrium oxide and yttrium fluoride is more advantageous. Patent Document 5 discloses such an attempt. While yttrium oxyfluoride-deposited parts are prepared by standard atmospheric plasma spraying of yttrium oxyfluoride, the deposition of yttrium oxyfluoride sprayed coatings is difficult because a compositional shift of fluorine depletion and oxygen enrichment occurs due to oxidation.

CITATION LIST

Patent Document 1: JP 3672833 (U.S. Pat. No. 6,576,354)
Patent Document 2: JP 4905697 (U.S. Pat. No. 7,655,328)
Patent Document 3: JP 3523222 (U.S. Pat. No. 6,685,991)
Patent Document 4: JP 3894313 (U.S. Pat. No. 7,462,407)
Patent Document 5: JP 5396672 (US 2015/0096462)

SUMMARY OF INVENTION

An object of the invention is to provide an yttrium fluoride spray material which ensures stable formation of an yttrium oxyfluoride sprayed coating by atmospheric plasma spraying, the yttrium oxyfluoride sprayed coating being minimized in process shift and particle release as compared with conventional sprayed coatings of yttrium oxide and yttrium fluoride; an yttrium oxyfluoride-deposited article obtained by spraying the yttrium spray material; and methods for preparing the spray material and article.

The inventors have found that an yttrium fluoride spray material consisting essentially of 30 to 90% by weight of $Y_5O_4F_7$ and the balance of $YF_3$ is effective for compensating for any compositional shift during atmospheric plasma spraying.

A first embodiment of the invention is an yttrium fluoride spray material comprising $Y_5O_4F_7$ and $YF_3$, the $Y_5O_4F_7$ and $YF_3$ consisting of 30 to 90% by weight of $Y_5O_4F_7$ and the balance of $YF_3$, and spray material having an average particle size of 10 to 60 μm and a bulk density of 1.2 to 2.5 g/cm$^3$.

A second embodiment of the invention is a method for preparing the yttrium fluoride spray material defined above, comprising the steps of mixing 10 to 50% by weight of yttrium oxide having an average particle size of 0.01 to 3 μm with the balance of an ammonium fluoride complex salt of formula: $(YF_3)_3NH_4F \cdot H_2O$, having an average particle size of 0.01 to 3 μm, granulating and firing.

A third embodiment of the invention is an yttrium-deposited article comprising a substrate and a coating sprayed thereon, the sprayed coating containing at least one yttrium oxyfluoride selected from the group consisting of YOF, $Y_5O_4F_7$, and $Y_7O_6F_9$.

A fourth embodiment of the invention is a method for preparing an yttrium-deposited article, comprising the step of atmospheric plasma spraying the yttrium fluoride spray material defined above to a substrate to form a sprayed coating containing at least one yttrium oxyfluoride selected from the group consisting of YOF, $Y_5O_4F_7$, and $Y_7O_6F_9$ thereon.

Advantageous Effects of Invention

The yttrium fluoride spray material of the invention ensures stable formation of an yttrium oxyfluoride sprayed coating by atmospheric plasma spraying.

DESCRIPTION OF PREFERRED EMBODIMENTS

The yttrium fluoride spray material of the invention contains yttrium oxyfluoride ($Y_5O_4F_7$) along with yttrium fluoride ($YF_3$). The yttrium fluoride spray material is preferably free of yttrium oxide ($Y_2O_3$). For example, an yttrium fluoride spray material in which yttrium oxyfluoride ($Y_5O_4F_7$) and yttrium fluoride ($YF_3$), especially, only both of $Y_5O_4F_7$ and $YF_3$ are detected as crystalline phases by X-ray diffraction is preferable. The yttrium fluoride spray material contains 30 to 90%, preferably 60 to 80% by weight of $Y_5O_4F_7$ and the balance of $YF_3$ with respect to the total of $Y_5O_4F_7$ and $YF_3$. The spray material may contains a small amount of other crystalline phases such as YOF, however, the total of $Y_5O_4F_7$ and $YF_3$ is preferably at least 90 wt %. Particularly, the spray material consisting essentially of $Y_5O_4F_7$ and $YF_3$ is more preferable. The yttrium fluoride spray material of the invention has an average particle size of 10 to 60 µm, preferably 25 to 45 µm and a bulk density of 1.2 to 2.5 g/cm³, preferably 1.3 to 2.0 g/cm³.

When a sprayed coating is formed by atmospheric plasma spraying of an yttrium fluoride spray material, the sprayed coating has an oxygen concentration which is increased and a fluorine concentration which is decreased, indicating partial oxidation of the spray material. This yttrium fluoride spray material is suited to form a stable yttrium oxyfluoride coating by atmospheric plasma spraying. From the standpoint of compensating for any compositional shift during atmospheric plasma spraying, an yttrium fluoride spray material consisting essentially of 30 to 90% by weight of $Y_5O_4F_7$ and the balance of $YF_3$ is effective, with respect to the total of $Y_5O_4F_7$ and $YF_3$.

Preferably the thermal spray powder material is free-flowing and composed of particles of spherical shape for thermal spraying. When a spray material is fed into a flame for thermal spraying, a poor flow may cause cumbersome operation such as clogging of a feed tube. To ensure a smooth flow, the spray material should preferably take the form of spherical particles, specifically having an aspect ratio of up to 2, more specifically up to 1.5. As used herein, the term "aspect ratio" is an index of particle configuration and refers to the ratio of length to breadth of a particle.

An angle of repose is an index of flow. A smaller angle of repose indicates better flow. The spray material preferably has an angle of repose of up to 45°, more preferably up to 40°. The angle of repose is determined by particle shape, particle size, particle size distribution, and bulk density. In order that the spray material have a small angle of repose, it should preferably have spherical shape, an average particle size of at least 10 µm, and a sharp particle size distribution.

The spray material in particulate form preferably has an average particle size D50 of from 10 µm to 60 µm. The average particle size D50 is determined by laser light diffractometry. If the particle size of spray material is too small, such particles may evaporate off the flame, resulting in a low yield of spraying. If the particle size of spray material is too large, such particles may not be completely melted in the flame, resulting in a sprayed coating of poor quality. It is important that spray material particles obtained by granulation be solid, i.e., filled to the interior (or free of voids), for the reason that solid particles are unbreakable and stable during handling, and the tendency that voided particles trap undesirable gas component in their voids is avoided.

Now the method for preparing the yttrium fluoride spray material is described. For example, 10 to 50% by weight of yttrium oxide having an average particle size of 0.01 to 3 µm is mixed with the balance of the ammonium fluoride complex salt of formula: $(YF_3)_3 NH_4F \cdot H_2O$ having an average particle size of 0.01 to 3 µm, and optionally with adding a binder. Organic compounds are preferable as the binder. Examples of the binder include organic compound consisting of carbon, hydrogen and oxygen or carbon, hydrogen, oxygen and nitrogen, such as carboxymethyl cellulose (CMC), polyvinyl alcohol (PVA) and polyvinyl pyrrolidone (PVP). The mixture is granulated and fired, yielding the desired yttrium fluoride spray material. The method for synthesizing the ammonium fluoride complex salt is described. For example, an yttrium nitrate solution is mixed with an acidic ammonium fluoride solution at a temperature of 0° C. to 80° C., preferably 40° C. to 70° C., from which a white precipitate crystallizes out. The precipitate is filtered, washed with water, and dried. It is identified to be an ammonium fluoride complex salt of formula: $(YF_3)_3 NH_4F \cdot H_2O$ by X-ray diffractometry analysis.

The firing step may be performed in vacuum or an inert gas atmosphere at a temperature of 600° C. to 1,000° C., preferably 700° C. to 900° C. for 1 to 12 hours, preferably 2 to 5 hours.

Thermal spraying of the yttrium fluoride spray material to a substrate is desirably performed under atmospheric pressure (normal pressure) or reduced pressure. Although the plasma gas is not particularly limited, examples of the plasma gas include nitrogen/hydrogen, argon/hydrogen, argon/helium, argon/nitrogen, argon alone, and nitrogen gas alone, with argon/nitrogen being preferred.

Examples of the substrate subject to thermal spraying include, but are not limited to, substrates of stainless steel, aluminum, nickel, chromium, zinc, and alloys thereof, alumina, aluminum nitride, silicon nitride, silicon carbide, and quartz glass, which serve as components of the semiconductor fabrication equipment. The sprayed coating typically has a thickness of 50 to 500 µm. The conditions under which the spray material is thermally sprayed are not particularly limited and may be determined as appropriate depending on the identity of substrate, a particular composition of the spray material and sprayed coating, and a particular application of the sprayed article.

According to the atmospheric plasma spraying of the yttrium fluoride spray material of the invention, a sprayed coating is formed and an yttrium oxyfluoride-deposited article including a substrate and a sprayed coating formed thereon is obtained. The sprayed coating contains at least one yttrium oxyfluoride selected from the group consisting of YOF, $Y_5O_4F_7$, and $Y_7O_6F_9$, particularly, YOF, or YOF and $Y_5O_4F_7$. The sprayed coating is preferably free of yttrium oxide ($Y_2O_3$) and desirably contains only yttrium oxyfluoride.

A typical example of argon/hydrogen plasma spraying is atmospheric plasma spraying using a gas mixture of 40 L/min of argon and 5 L/min of hydrogen with air as an ambient gas. The thermal spraying conditions including a spray distance, current value, voltage value, and the feed rates of argon and hydrogen gases may be determined as appropriate depending on a particular application of the sprayed component or the like. A powder hopper is charged with a predetermined amount of spray material, which is fed with the aid of a carrier gas (typically argon) through a powder hose to the front end of the plasma spraying gun. While the spray material is continuously fed into the plasma flame, it is completely melted and liquefied, forming a liquid flame under the impetus of plasma jet. The liquid flame impinges against a substrate, whereupon molten particles are fused, solidified, and deposited thereon. On this principle, an yttrium oxyfluoride-deposited article (sprayed member) can be manufactured by forming yttrium oxyfluoride sprayed coating within a predetermined coating region on the substrate by moving the flame from right to left and/or up and down with a robot or human arm.

The sprayed article is evaluated for particle release, for example, by a simple particle test. The deposited article is immersed in a predetermined volume of pure water for a predetermined time under ultrasonic agitation. Nitric acid is added to the collected immersion solution to dissolve particles. The yttrium content of the solution is measured by inductively coupled plasma (ICP) spectroscopy. A lower yttrium content indicates fewer particles.

EXAMPLE

Examples are given below by way of illustration and not by way of limitation. In Table, wt % is percent by weight.

Reference Example 1

Preparation of Ammonium Fluoride Complex Salt

A 1 mol/L yttrium nitrate solution, 1 L, was heated at 50° C. and mixed with 1 L of a 1 mol/L acidic ammonium fluoride solution at 50° C. for about 30 minutes with stirring. A white precipitate crystallized out. The precipitate was filtered, washed with water and dried. On X-ray diffractometry analysis, it was identified to be an ammonium fluoride complex salt of formula: $(YF_3)_3NH_4F \cdot H_2O$. It had an average particle size of 0.7 μm as measured by laser light diffractometry.

Examples 1 to 5 and Comparative Examples 1 and 2

Preparation of Spray Powder (Spray Material)

A spray powder material was obtained by mixing predetermined amounts of ingredients to form a mix as shown in Table 1, dispersing the mix in water, with adding a binder in Examples 1 to 4 and Comparative Examples 1 and 2 or without adding a binder in Example 5, shown in Table 1 to form a slurry, granulating by means of a spray dryer, and firing under the conditions shown in Table 1. The resulting spray powder was identified and measured for crystal structure, particle size distribution, bulk density, angle of repose, and yttrium, fluorine, oxygen, carbon and nitrogen concentrations. The results are shown in Table 1. Notably, the identification was performed by X-ray diffractometry, the particle size distribution was measured by laser light diffractometry, the bulk density and angle of repose were measured by a powder tester, yttrium concentration was analyzed by ethylenediamine tetraacetic acid (EDTA) titration method of dissolved samples, the fluorine concentration was analyzed by dissolution ion chromatography, and the oxygen, carbon and nitrogen concentrations were analyzed by the infrared (IR) method after combustion. In each of Examples 1-5 and Comparative Examples 1 and 2, carbon and nitrogen were not detected, i.e., carbon and nitrogen concentrations were 0 wt %, respectively. Each of contents of the yttrium compound components was determined as follows. In Examples 1 to 5 and Comparative Example 1, $Y_5O_4F_7$ content was calculated based on the oxygen concentration, and $YF_3$ content was calculated as the balance. In Comparative Example 2, content of each of three substances (crystalline phases), which was identified by X-ray diffractometry, was calculated from scale factors of the crystalline phases.

Preparation of Sprayed Article

Each of the spray powder materials in Examples 1 to 5 and Comparative Examples 1 and 2 was deposited onto an aluminum substrate by atmospheric plasma spraying using a gas mixture of 40 L/min of argon and 5 L/min of hydrogen with air as an ambient gas. The deposited article (sprayed member) had a sprayed coating of about 200 μm thick. The sprayed coating was scraped off the coated article. The sprayed coating was identified by X-ray diffractometry, and analyzed for yttrium concentration by ethylenediamine tetraacetic acid (EDTA) titration method of dissolved samples, fluorine concentration by dissolution ion chromatography, and oxygen concentrations by the combustion IR method. The results are shown in Table 2.

In Examples 1 to 5, the yttrium fluoride spray material which had been prepared by mixing 10 to 50% by weight of yttrium oxide with the balance of ammonium fluoride complex salt of $(YF_3)_3NH_4F \cdot H_2O$, granulating and firing was a mixture of 30 to 90% by weight of $Y_5O_4F_7$ and the balance of $YF_3$. When the spray material was deposited onto an aluminum substrate by atmospheric plasma spraying using a gas mixture of 40 L/min of argon and 5 L/min of hydrogen with air as an ambient gas, the sprayed coating consisted of at least one yttrium oxyfluoride selected from among YOF, $Y_5O_4F_7$, and $Y_7O_6F_9$.

In Comparative Examples 1 and 2, the yttrium fluoride spray material was prepared by mixing predetermined amounts of yttrium oxide ($Y_2O_3$) and yttrium fluoride ($YF_3$), granulating and firing. When the spray material was deposited onto an aluminum substrate by atmospheric plasma spraying using a gas mixture of 40 L/min of argon and 5 L/min of hydrogen with air as an ambient gas and deposited article was obtained, the sprayed coating contained $Y_2O_3$.

The deposited articles of Examples 1 to 5 and Comparative Examples 1 and 2 were washed with running pure water at a flow rate of 100 L/hr before they were immersed in 10 L of pure water for 10 minutes under ultrasonic agitation. To the collected immersion solution, 100 mL of 2 mol/L nitric acid was added. The yttrium content of the solution was measured by ICP. The results are shown in Table 3.

TABLE 1

| | | Example | | | | | Comparative Example | |
|---|---|---|---|---|---|---|---|---|
| | | 1 | 2 | 3 | 4 | 5 | 1 | 2 |
| Ingredients, particle size, and mixing ratio | | $Y_2O_3$ (D50 = 0.3 μm) | | | | | | |
| | | 20 wt % | 30 wt % | 40 wt % | 50 wt % | 20 wt % | 10 wt % | 50 wt % |
| | | $(YF_3)_3NH_4FH_2O$ (D50 = 0.7 μm) | | | | | $YF_3$ (D50 = 1.4 μm) | |
| | | 80 wt % | 70 wt % | 60 wt % | 50 wt % | 80 wt % | 90 wt % | 50 wt % |
| Granulation conditions | Mix Binder* | 25 wt % CMC 8 wt % | 25 wt % CMC 8 wt % | 25 wt % PVA 8 wt % | 25 wt % PVP 8 wt % | 25 wt % none | 25 wt % CMC 8 wt % | 25 wt % CMC 8 wt % |

TABLE 1-continued

|  |  | Example | | | | | Comparative Example | |
|---|---|---|---|---|---|---|---|---|
|  |  | 1 | 2 | 3 | 4 | 5 | 1 | 2 |
| Firing conditions | Atmosphere | N$_2$ | vacuum | N$_2$ | N$_2$ | N$_2$ | N$_2$ | N$_2$ |
|  | Temperature | 800° C. | 900° C. | 900° C. | 800° C. | 800° C. | 800° C. | 800° C. |
| Analysis of spray powder | | | | | | | | |
| Particle size distribution | D10, μm | 23 | 18 | 25 | 21 | 23 | 22 | 23 |
|  | D50, μm | 37 | 28 | 38 | 33 | 37 | 37 | 34 |
|  | D90, μm | 54 | 48 | 65 | 47 | 54 | 59 | 64 |
| Bulk density, g/cm$^3$ | | 1.3 | 1.6 | 1.7 | 1.3 | 1.3 | 1.3 | 1.4 |
| Angle of repose, ° | | 39 | 38 | 36 | 39 | 39 | 42 | 41 |
| Y concentration, wt % | | 66.9 | 68.4 | 67.4 | 67.9 | 66.9 | 65.6 | 72.7 |
| F concentration, wt % | | 28.8 | 24.5 | 24.6 | 22.9 | 28.8 | 32.1 | 16.4 |
| O concentration, wt % | | 4.3 | 7.1 | 8.0 | 9.2 | 4.3 | 2.3 | 10.9 |
| X-ray diffraction analysis | | Y$_5$O$_4$F$_7$ 43 wt % YF$_3$ 57 wt % | Y$_5$O$_4$F$_7$ 71 wt % YF$_3$ 29 wt % | Y$_5$O$_4$F$_7$ 80 wt % YF$_3$ 20 wt % | Y$_5$O$_4$F$_7$ 92 wt % YF$_3$ 8 wt % | Y$_5$O$_4$F$_7$ 43 wt % YF$_3$ 57 wt % | Y$_5$O$_4$F$_7$ 23 wt % YF$_3$ 77 wt % | Y$_5$O$_4$F$_7$ 87 wt % YF$_3$ 9 wt % Y$_2$O$_3$ 4 wt % |

*CMC: carboxymethyl cellulose, PVA: polyvinyl alcohol, PVP: polyvinyl pyrrolidone

TABLE 2

| Analysis of sprayed coating | Example | | | | | Comparative Example | |
|---|---|---|---|---|---|---|---|
|  | 1 | 2 | 3 | 4 | 5 | 1 | 2 |
| Y concentration, wt % | 66 | 69.6 | 72.4 | 71.5 | 66 | 66 | 73 |
| F concentration, wt % | 26.7 | 21.4 | 16.6 | 15 | 26.7 | 30.4 | 14.3 |
| O concentration, wt % | 7.3 | 9 | 11 | 13.5 | 7.3 | 3.6 | 12.7 |
| X-ray diffraction analysis | Y$_5$O$_4$F$_7$ YOF | Y$_5$O$_4$F$_7$ YOF | Y$_5$O$_4$F$_7$ YOF | YOF | Y$_5$O$_4$F$_7$ YOF | Y$_5$O$_4$F$_7$ YF$_3$ Y$_2$O$_3$ | YOF Y$_2$O$_3$ |

TABLE 3

| Simple particle test | Example | | | | | Comparative Example | |
|---|---|---|---|---|---|---|---|
|  | 1 | 2 | 3 | 4 | 5 | 1 | 2 |
| Y concentration, mg/L | 3 | 5 | 7 | 10 | 3 | 20 | 30 |

Japanese Patent Application No. 2015-208616 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for preparing a spray material comprising Y$_5$O$_4$F$_7$ and YF$_3$, the Y$_5$O$_4$F$_7$ and YF$_3$ consisting of 30 to 71% by weight of Y$_5$O$_4$F$_7$ and the balance 29 to 70% by weight of YF$_3$, the spray material having an average particle size of 10 to 60 μm and a bulk density of 1.2 to 2.5 g/cm$^3$, the method comprising the steps of:

mixing 10 to 50% by weight of yttrium oxide having an average particle size of 0.01 to 3 •m with the balance of an ammonium fluoride complex salt of formula: (YF$_3$)$_3$NH$_4$F·H$_2$O having an average particle size of 0.01 to 3 •m, and granulating and firing the mixture.

2. The method of claim 1 wherein in the mixing step, 10 to 40% by weight of yttrium oxide is mixed with the balance of said ammonium fluoride complex salt.

3. The method of claim 1 wherein the spray material is free of Y$_2$O$_3$.

4. The method of claim 1 wherein the total of Y$_5$O$_4$F$_7$ and YF$_3$ contained in the spray material is at least 90 wt %.

5. The method of claim 1 wherein the spray material has an average particle size of 33 to 60 •m.

6. The method of claim 1 wherein the spray material has an angle of repose of up to 45°.

* * * * *